United States Patent
Kanskar et al.

(10) Patent No.: US 10,777,968 B2
(45) Date of Patent: Sep. 15, 2020

(54) METHOD, SYSTEM AND APPARATUS FOR HIGHER ORDER MODE SUPPRESSION

(71) Applicant: nLIGHT, Inc., Vancouver, WA (US)

(72) Inventors: Manoj Kanskar, Portland, OR (US); Zhigang Chen, Portland, OR (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/796,355

(22) Filed: Oct. 27, 2017

(65) Prior Publication Data

US 2018/0123317 A1    May 3, 2018

Related U.S. Application Data

(60) Provisional application No. 62/414,377, filed on Oct. 28, 2016.

(51) Int. Cl.
*H01S 5/065* (2006.01)
*H01S 5/20* (2006.01)
(Continued)

(52) U.S. Cl.
CPC ............ *H01S 5/0653* (2013.01); *H01S 5/026* (2013.01); *H01S 5/0287* (2013.01);
(Continued)

(58) Field of Classification Search
CPC .... H01S 5/0653; H01S 5/2036; H01S 5/2022; H01S 5/1064; H01S 5/026; H01S 5/2205;
(Continued)

(56) References Cited

U.S. PATENT DOCUMENTS

| | | | |
|---|---|---|---|
| 6,862,300 B1 * | 3/2005 | Traut | ........................ H01S 5/22 372/19 |
| 7,596,159 B2 | 9/2009 | Kanskar et al. | |

(Continued)

FOREIGN PATENT DOCUMENTS

| | | |
|---|---|---|
| WO | 2016197137 A1 | 12/2016 |
| WO | 2017117555 A1 | 7/2017 |

OTHER PUBLICATIONS

European Patent Office (Munich); International Search Report and Written Opinion PCT/US2017/058819; dated Apr. 23, 2018; 17 pages.

*Primary Examiner* — Xinning (Tom) Niu
(74) *Attorney, Agent, or Firm* — Michelle Craig

(57) ABSTRACT

A laser diode vertical epitaxial structure, comprising a transverse waveguide comprising an active layer between an n-type semiconductor layer and a p-type semiconductor layer wherein the transverse waveguide is bounded by a lower index n-cladding layer on an n-side of the transverse waveguide and a lower index p-cladding layer on a p-side of the transverse waveguide, a lateral waveguide that is orthogonal to the transverse waveguide, wherein the lateral waveguide is bounded in a longitudinal direction at a first end by a facet coated with a high reflector (HR) coating and at a second end by a facet coated with a partial reflector (PR) coating and a higher order mode suppression layer (HOMSL) disposed adjacent to at least one lateral side of the lateral waveguide and that extends in a longitudinal direction.

18 Claims, 12 Drawing Sheets

(51) Int. Cl.
  *H01S 5/10* (2006.01)
  *H01S 5/042* (2006.01)
  *H01S 5/026* (2006.01)
  *H01S 5/028* (2006.01)
  *H01S 5/12* (2006.01)
  *H01S 5/22* (2006.01)
  *H01S 5/34* (2006.01)

(52) U.S. Cl.
  CPC ........ *H01S 5/04256* (2019.08); *H01S 5/1064* (2013.01); *H01S 5/1206* (2013.01); *H01S 5/2018* (2013.01); *H01S 5/2022* (2013.01); *H01S 5/2036* (2013.01); *H01S 5/2205* (2013.01); *H01S 5/04254* (2019.08); *H01S 5/34* (2013.01); *H01S 2301/166* (2013.01)

(58) Field of Classification Search
  CPC .... H01S 5/2018; H01S 5/1206; H01S 5/0287; H01S 2301/166; H01S 5/0425; H01S 5/34
  See application file for complete search history.

(56) References Cited

U.S. PATENT DOCUMENTS

| | | | |
|---|---|---|---|
| 8,537,869 B2 | 9/2013 | Crump et al. | |
| 9,166,368 B2 | 10/2015 | Kanskar | |
| 9,214,786 B2 | 12/2015 | Hemenway et al. | |
| 9,270,085 B1 | 2/2016 | Kanskar | |
| 9,373,936 B1 | 6/2016 | Kanskar et al. | |
| 9,496,683 B1 | 11/2016 | Kanskar | |
| 9,553,424 B2 | 1/2017 | Kanskar | |
| 9,673,591 B2 | 6/2017 | Kanskar | |
| 9,705,289 B2 | 7/2017 | Kanskar et al. | |
| 9,720,145 B2 | 8/2017 | Kanskar | |
| 2001/0050531 A1* | 12/2001 | Ikeda | B82Y 20/00 313/498 |
| 2004/0125831 A1* | 7/2004 | Fischer | H01S 5/028 372/20 |
| 2006/0193353 A1* | 8/2006 | Kim | H01S 5/1028 372/19 |
| 2008/0089374 A1 | 4/2008 | Eichler | |
| 2008/0212635 A1 | 9/2008 | Kanskar et al. | |
| 2011/0032956 A1 | 2/2011 | Kanskar | |
| 2011/0116523 A1 | 5/2011 | Kanskar et al. | |
| 2011/0176568 A1 | 7/2011 | Satoh | |
| 2012/0287957 A1 | 11/2012 | Crump | |
| 2013/0142210 A1* | 6/2013 | Kyono | B82Y 20/00 372/45.011 |
| 2014/0064311 A1 | 3/2014 | Eichler | |
| 2016/0104997 A1 | 4/2016 | Kanskar | |
| 2017/0055365 A1 | 2/2017 | Sanders et al. | |
| 2017/0194760 A1 | 7/2017 | Kanskar | |
| 2017/0288370 A1 | 10/2017 | Chen | |

\* cited by examiner

METHOD, SYSTEM AND APPARATUS FOR HIGHER ORDER MODE SUPPRESSION

CROSS-REFERENCE TO RELATED APPLICATION

Application claims the benefit of U.S. Provisional Patent Application No. 62/414,377, filed Oct. 28, 2016, which is incorporated herein by reference for all purposes.

TECHNICAL FIELD

The technology disclosed herein relates to diode lasers, more particularly to methods, systems and apparatus for suppressing higher order modes in diode lasers.

BACKGROUND

Lasers are light emitting devices. Light emission in a laser occurs as a result of optical amplification by stimulated emission of electromagnetic radiation. Some lasers emit spatially and temporally coherent light which allows lasers to emit light in a narrow light bandwidth that can be narrowly focused over long distances. There are a wide variety of lasers, for example, gas lasers, chemical lasers, dye lasers, metal-vapor lasers, solid-state lasers, and semiconductor lasers. Laser diodes are electrically pumped semiconductor lasers, in which an active layer is formed by a p-n junction of a semiconductor diode. Laser diodes typically comprise an active layer disposed between a p-type layer of semiconductor material and an n-type layer of semiconductor material. Many laser diodes are fabricated on a semiconductor substrate such as gallium arsenide, doped with elements such as aluminum, silicon, zinc, carbon or selenium to produce the n- and p-type semiconductor layers. The active layer is typically un-doped gallium-indium-arsenide and may be only a few nanometers thick.

Laser diodes are formed by growing multiple layers of semiconductor materials on a suitable substrate with a lattice constant that allows choice of materials to produce desired emission wavelengths. A typical laser diode comprises n-type layers, p-type layers and an undoped active layer between them such that when the diode is forward-biased, electrons and holes recombine in the active region layer to produce light. The active layer (quantum well(s), quantum wire(s) or quantum dots, type-II quantum well(s)) resides in a waveguide layer which has a higher index of refraction compared to the surrounding p- and n-doped cladding layers. Light generated from the active layer is confined in the plane of the waveguide.

A conventional edge-emitting Fabry Perot broad area laser diode is arranged as a rectangular gain or index-guided semiconductor structure. Opposing end facets of the waveguide define high and partial reflectors to provide feedback for oscillation of light within the resonator. The multi-layered laser diode structure extends the length of the laser and has a broad width for electrical injection extending to opposite side surfaces which also extend the length of the laser. The multi-layered semiconductor materials are typically arranged so that the laser operates in a single mode along the growth direction of the laser and this direction is defined as the fast-axis direction. Since along the fast-axis direction the semiconductor laser operates in a single mode, the brightness of laser diode in this direction cannot be improved any further—it is so called diffraction-limited. The distance between the top and bottom surfaces of the multi-layered semiconductor laser structure thus provides the smaller dimension of the end facets, i.e., the thickness of the stripe, typically on the order of microns. On the other hand, the width of the multi-layered laser structure provides the larger dimension of the end facets, i.e., the stripe-width is typically on the order of many tens of microns to hundreds of microns. This is referred to as the "slow axis." Because the stripe width is much larger than the wavelength of light, the lateral property of an optical field propagating along the optical axis of the waveguide is highly multimode along the wider stripe dimension and the corresponding axis is described as slow-axis because the divergence angle is much smaller relative to the fast-axis divergence angle.

"Multimode laser diodes" or "broad area lasers" (BALs) are used in high power applications. BALs have multiple modes in the slow axis, so that their slow-axis beam-parameter-product (BPP) are higher than that in single-mode laser diodes. Furthermore, as they are driven to higher currents, the thermal lensing gets more pronounced which causes higher index contrast profile in the lateral direction leading to accommodation of even more modes. Consequently, as the lateral divergence angle widens this leads to degradation in lateral beam-parameter-product (BPP) and brightness (power÷BPP).

Brightness can be improved in BALs by reducing the emitter width; however, the current at which the maximum brightness occurs also happens at progressively lower current values. Hence, the maximum output power at the maximum brightness also drops. For power-scaling applications and reducing the cost-per-watt of producing diode lasers, higher brightness at higher output power per emitter is very desirable.

SUMMARY

Various implementations include a laser diode vertical epitaxial structure, including a transverse waveguide including an active layer between an n-type semiconductor layer and a p-type semiconductor layer wherein the transverse waveguide is bounded by a lower index n-cladding layer on an n-side of the transverse waveguide and a lower index p-cladding layer on a p-side of the transverse waveguide, a lateral waveguide that is orthogonal to the transverse waveguide, wherein the lateral waveguide is bounded in a longitudinal direction at a first end by a facet coated with a high reflector (HR) coating and at a second end by a facet coated with a partial reflector (PR) coating, and a higher order mode suppression layer (HOMSL) disposed adjacent to at least one lateral side of the lateral waveguide and that extends in a longitudinal direction. The laser diode epitaxial structure, wherein the HOMSL comprises an absorbing material or an aperiodic structure including at least two different materials having different indexes of refraction, or any combination thereof. The laser diode epitaxial structure, wherein the HOMSL comprises the aperiodic structure including a pattern of a low-index material alternating with a high index material wherein the low-index material has an index of refraction that is less than an effective index of refraction of the lateral waveguide and wherein the high-index material has an index of refraction that is higher than the effective index of refraction of the lateral waveguide The laser diode epitaxial structure, wherein an average index of refraction of the aperiodic structure is less than an effective index of refraction of the lateral waveguide such that the HOMSL is index-guiding. The laser diode epitaxial structure, wherein an average index of refraction of the aperiodic structure is greater than an effective index of refraction of the lateral waveguide. The laser diode epitaxial structure, wherein the HOMSL is arranged in two rectangular stripes having one of each of the two rectangular HOMSL stripes along each of two lateral sides of the lateral waveguide in the longitudinal direction. The laser diode epitaxial structure, wherein the two rectangular HOMSL stripes extend from the first end to the second end. The laser diode epitaxial structure, wherein the two rectangular HOMSL stripes extend from the first end a distance less than the distance between the first end and the second end. The laser diode epitaxial structure, wherein the HOMSL is arranged in a single rectangular stripe along one lateral side of the lateral waveguide in the longitudinal direction. The laser diode epitaxial structure, wherein the rectangular HOMSL stripe extends from the first end to the second end. The laser diode epitaxial structure, wherein the rectangular HOMSL stripe extend from the first end a distance less than the distance between the first end and the second end. The laser diode epitaxial structure, wherein the lateral waveguide is defined by at least one of an etched-ridge or current injection with gain guiding. The laser diode epitaxial structure, wherein the lateral waveguide is confined by current injection with gain guiding. The laser diode epitaxial structure, wherein the current injection is configured to enable higher order mode suppression via gain tailoring. The laser diode epitaxial structure, wherein the gain tailoring is directed from an n-metal contact on the n-side of the laser diode epitaxial structure to the p-metal contact on the p-side of the epitaxial structure. The laser diode epitaxial structure, wherein the n-metal contact is narrower in the lateral direction than the p-metal contact in the lateral direction. The laser diode epitaxial structure, wherein a first edge of the n-metal contact aligns to a center-plane of an emitter face of the laser diode epitaxial structure. The laser diode epitaxial structure, wherein a first edge of the n-metal contact is parallel with the HR facet and a second edge is parallel with the PR facet and wherein the first edge is narrower than the second edge.

Additional implementations include a laser diode, including a transverse waveguide including an active layer between an n-type semiconductor layer and a p-type semiconductor layer wherein the transverse waveguide is bounded by a lower index n-cladding layer on an n-side and a p-cladding layer on a p-side, a lateral waveguide that is orthogonal to the transverse waveguide, the lateral waveguide defined by at least one of an etched ridge or current injection with gain guiding, or a combination thereof, the lateral waveguide bounded in the longitudinal direction at a first end by a facet coated with a high reflector coating and at a second end by a facet coated with a partial reflector coating, and a higher order mode suppression layer (HOMSL) disposed adjacent to the lateral waveguide and extending in a longitudinal direction from the HR facet a length less than the distance between the HR facet and the PR facet. The laser diode, wherein the HOMSL comprises a high-index material, an absorbing material or an aperiodic material, or any combination thereof.

Further implementations include a laser diode, including a transverse waveguide including an active layer between an n-type semiconductor layer and a p-type semiconductor layer wherein the transverse waveguide is bounded by a lower index n-cladding layer on an n-side and a p-cladding layer on a p-side, a lateral waveguide that is orthogonal to the transverse waveguide, the lateral waveguide defined by current injection with gain guiding, an n-metal contact on the n-side, and a p-metal contact on the p-side of the laser diode, wherein the n-metal contact is configured to enable a lateral carrier distribution pattern from the n-metal contact to the p-metal contact such that higher order mode proliferation is suppressed in the lateral waveguide via reduced gain exposure of the higher order modes versus gain exposure to the lower order modes and a fundamental mode.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

DETAILED DESCRIPTION

Figure 1:
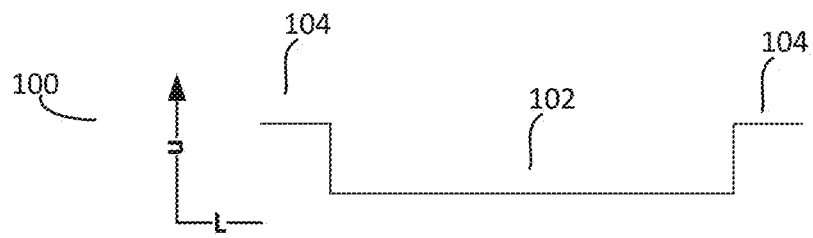
FIG. 1 depicts a lateral effective index profile for an example laser diode with a higher order mode suppression layer disposed adjacent a lateral waveguide.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed technology. These terms are high-level abstractions of the actual operations that are performed. The actual operations that correspond to these terms will vary depending on the particular implementation and are readily discernible by one of ordinary skill in the art.

In some examples, values, procedures, or apparatus' may be referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Higher Order Mode Suppression Layer (HOMSL)

What is needed to overcome the shortcomings of conventional laser diodes discussed above in the Background is a laser diode that is configured to suppress higher order modes in the lateral direction (i.e., orthogonal to the propagation direction) while conserving lower order mode light. This can be accomplished by juxtaposing higher order mode suppressing structures adjacent to the lateral waveguide of the laser diode. Higher order mode suppressing structures may include a variety of materials and may be index guiding structures, anti-wave guiding structures, and/or high loss structures.

In one example, a higher order mode suppression layer (HOMSL) may be disposed adjacent to the lateral waveguide at or near the rear facet and extending less than the full-length of the waveguide along the longitudinal direction. HOMSL may comprise: index guiding structures, anti-wave guiding structures and/or high loss structures. For example, the index guiding, anti-waveguiding, and/or high loss structures may extend up to 20% or in another example between about 5%-50% of the length of the waveguide measured from the rear facet. Extending the HOMSL only a short distance along the longitudinal direction minimizes loss for the unsuppressed modes of the laser diode and enables the diode to operate more efficiently than if a HOMSL structure were to extend the entire length.

In another example, HOMSL may be disposed adjacent to a flared laser oscillator waveguide either extending a full longitudinal length of the waveguide or a partial longitudinal length of the waveguide as measured from the rear facet. By assembling the diode in this way the benefit of reducing higher order modes by suppressing them using HOMSL can be compounded with the benefits of using a flared laser oscillator waveguide (FLOW) as described in U.S. Pat. No. 9,166,369, which is incorporated herein by reference.

In yet another example, a laser diode can include a buried aperiodic high- and low-index structure with high loss in the high index material disposed adjacent to the waveguide along the longitudinal direction. The aperiodic structure may suppress higher order modes by disproportionately overlapping higher order modes compared to lower order modes and/or the fundamental mode. The aperiodic structures are selected to introduce high loss to higher order modes but minimize loss to lower order modes and/or fundamental mode. The aperiodic structure may be disposed along an entire length of the waveguide along the longitudinal direction or a shorter length extending from the rear facet. The aperiodic structure may also be disposed along the longitudinal direction of a broad area laser (BAL) and/or a flared laser oscillating waveguide.

FIG. 1 depicts an index profile 100 showing the relative index of refraction for an example lateral waveguide with adjacent HOMSL. Section 102 of index profile 100 represents the relative index of refraction of the lateral waveguide versus sections 104 representing the relative index of refraction of the adjacent HOMSL.

In an example, the HOMSL is an anti-wave guiding structure comprising a variety of materials having an index of refraction that is higher than the index of refraction of the waveguide. The HOMSL may comprise a variety of doped or undoped materials. The HOMSL material may be judiciously chosen to optimize efficiency versus beam parameter product (BPP) at the laser operating condition. Some examples of anti-wave guiding HOMSL materials when the native waveguide comprises AlGaAs include doped gallium arsenide (GaAs), indium gallium arsenide (InGaAs), or the like or combinations thereof. Other combinations of materials forming the waveguide and anti-waveguiding structures will occur to those skilled in the art and claimed subject matter is not limited in this regard.

Figure 2:
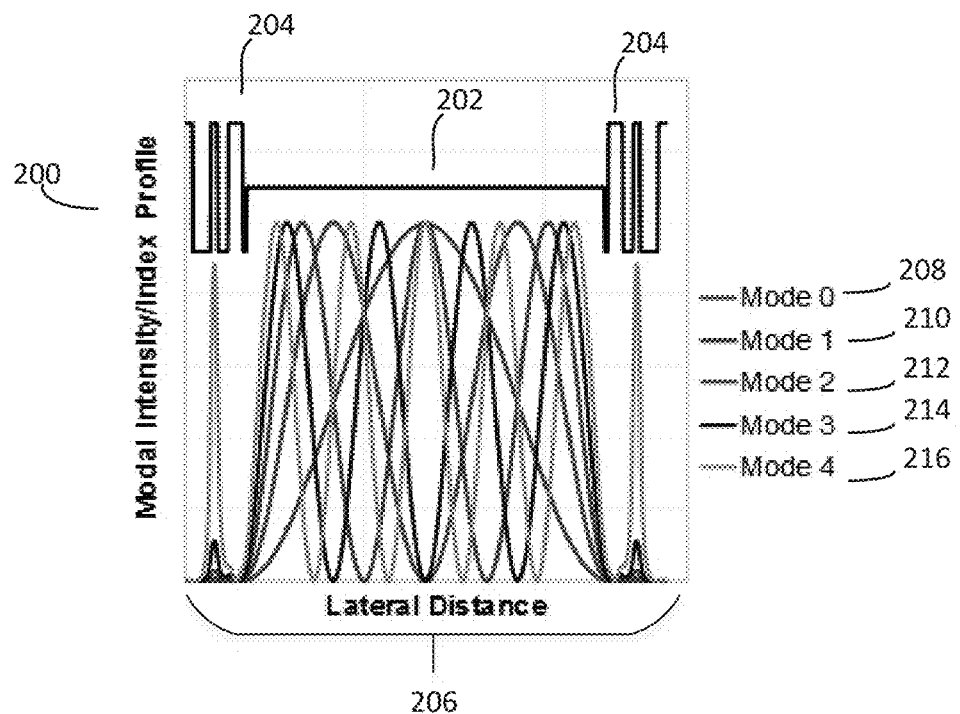
FIG. 2 depicts a lateral index profile and modal modeling for an example laser diode with a higher order mode suppression layer disposed adjacent the lateral waveguide.

FIG. 2 depicts an index profile 200 showing the relative index of refraction for an example lateral waveguide with a HOMSL disposed adjacent to the lateral waveguide and modal modeling for the first several lateral waveguide modes. Section 202 of index profile 200 represents the relative index of refraction of the lateral waveguide versus sections 204 representing the relative indices of refraction of the HOMSL. In an example, the HOMSL is an index guiding aperiodic structure comprising high- and low-index materials with high loss in the high index material which disproportionately overlaps higher order modes compared to lower order/fundamental modes. In an example, the low-index material has an index of refraction that is lower than the effective index of refraction of the lateral waveguide and the high-index material has an index of refraction that is higher than the effective index of refraction of the lateral waveguide. Sections 204 show the relative indices of the aperiodic structure with high and low index materials. The average index of refraction of the HOMSL may be lower than the modal index, so that the HOMSL is in the index guiding regime instead of anti-guiding, but the locally high index areas pull in the electric field or intensity and interacts with the material locally and introduce high loss to the higher order modes. Modal modeling 206 illustrates modal behavior of modes 0-4. The higher the modal number, the more overlap the mode has with the high-index region of the HOMSL, hence higher loss in the higher order modes versus the lower order modes (210-216)/fundamental mode (208).

Examples in FIGS. 3-26 depict examples of quantum well lasers for simplicity and illustrative purposes. However, various other laser types may be configured to include HOMSL features such as double heterostructure lasers, interband cascade lasers, distributed Bragg reflector lasers, distributed feedback lasers, quantum cascade lasers, vertical cavity surface emitting lasers and/or vertical external cavity surface emitting lasers, to name a few. Therefore, claimed subject matter is not limited to quantum well laser diodes.

Figure 3:
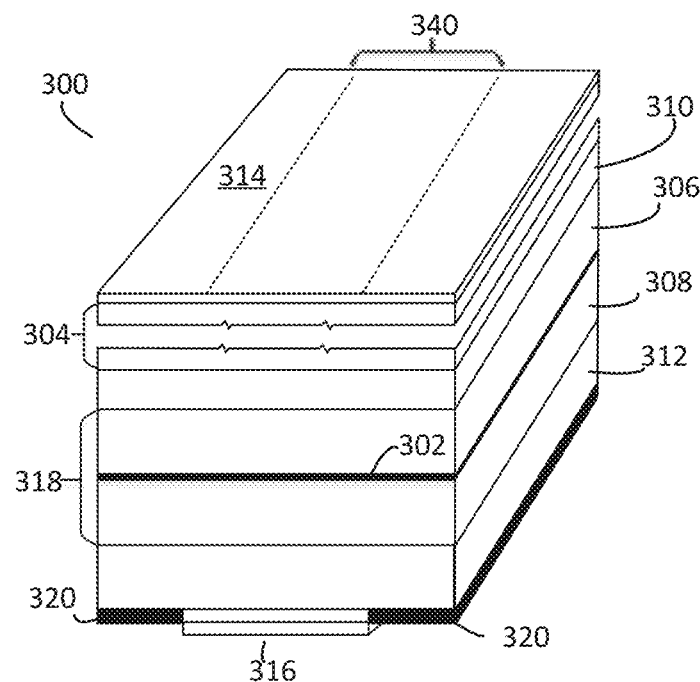
FIG. 3 illustrates a cross-sectional perspective view depicting a vertical epitaxial layer structure of an example laser diode including a higher order mode suppression layer disposed adjacent to the lateral waveguide.

FIG. 3 illustrates a cross-sectional perspective view depicting a vertical epitaxial layer structure of an example laser diode including a higher order mode suppression layer disposed adjacent to the lateral waveguide. In an example, laser diode 300 is a quantum well laser.

In an example, laser diode 300 is fabricated to include a substrate 304, an n-type semiconductor layer 306 and a p-type semiconductor layer 308. Quantum well 302 resides between n-type semiconductor layer 306 and p-type semiconductor layer 308. An n-cladding layer 310 is disposed outside of n-type semiconductor layer 306. A p-cladding layer 312 is disposed outside of p-type semiconductor layer 308. N-metal contact 314 is disposed on n-substrate 304. P-metal contact 316 is positioned under p-cladding layer 312. Quantum well 302, n-type semiconductor layer 306 and p-type semiconductor layer 308 make-up the transverse waveguide 318 portion of laser diode 300. The boundary of the lateral waveguide 340 is illustrated by dotted lines extending along the longitudinal direction on n-metal contact 314.

Lateral beam size of the diode laser is determined by the width of the active region or the width of the lateral waveguide. Because the width of the waveguide in the lateral direction is significantly greater than the wavelength of light, many modes will be generated in the lateral direction. HOMSL 320 is disposed adjacent to lateral waveguide 340 along the longitudinal direction. Furthermore, in FIG. 3 HOMSL 320 is located between air and p-cladding layer 312 outside of transverse waveguide 318. However, it is not necessary for HOMSL 320 to be positioned there. HOMSL 320 may be located in a variety of positions in the epitaxial structure and claimed subject matter is not limited in this regard.

In an example, HOMSL 320 comprises high index material wherein the index of HOMSL 320 is higher than the index of lateral of lateral waveguide 340. HOMSL 320 is configured to introduce differentially more loss to higher order modes thereby suppressing them in the lateral (i.e., orthogonal to propagation) direction. Inclusion of this buried or surface high index material disproportionately anti-guides higher order modes that overlap with the high index material compared to lower order modes/fundamental mode.

A variety of well-known materials and methods may be used to fabricate laser diode 300. For example, substrate 304 may comprise gallium arsenide (GaAs). N-type semiconductor layer 306, p-type semiconductor layer 308, n-cladding 310, and/or p-cladding 312 may be grown on GaAs substrate 304 and comprise any of: Indium (In), Gallium (Ga), Aluminum (Al), Arsenic (As), Phosphorous (P), Gallium Arsenide (GaAs), Indium Phosphide (InP) or the like or any combinations thereof. N-type and p-type layers may be doped with doping agents to produce the desired n-type or p-type materials. Claimed subject matter is not limited in this regard.

The HOMSL 320 material may be absorbing materials so that it absorbs high order modes to optimize efficiency versus beam parameter product (BPP) at the operating condition. The HOMSL 320 material may be absorbing or non-absorbing.

Figure 4:
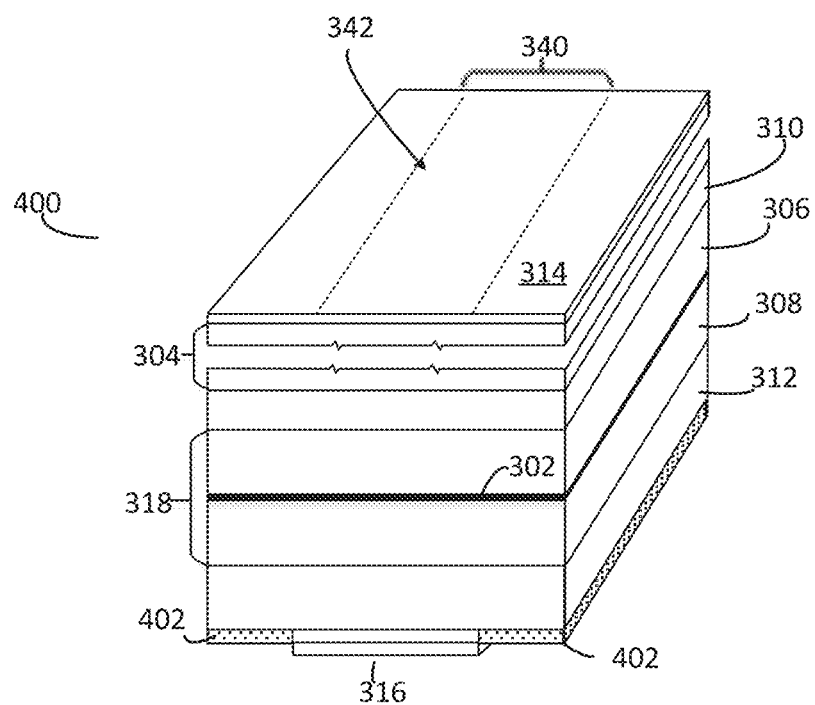
FIG. 4 illustrates a cross-sectional perspective view depicting a vertical epitaxial layer structure of an example laser diode including a higher order mode suppression layer disposed adjacent to the lateral waveguide.
Figure 5:
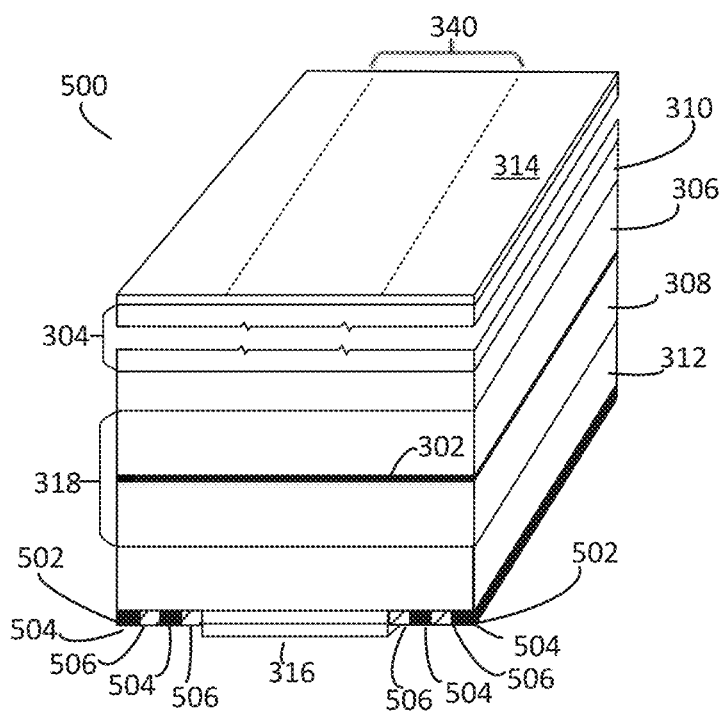
FIG. 5 illustrates a cross-sectional perspective view depicting a vertical epitaxial layer structure of an example laser diode including a higher order mode suppression layer disposed adjacent to the lateral waveguide.

FIG. 4 illustrates a cross-sectional perspective view depicting a vertical epitaxial layer structure of an example laser diode including a higher order mode suppression layer disposed adjacent to the lateral waveguide. In an example, laser diode 400 is a quantum well laser similar to the laser diode depicted in FIG. 3. However, laser diode 400 includes HOMSL 402 comprising an absorbing material. The absorbing material selected for HOMSL 402 may comprise semiconductor material like those mentioned above, metal (e.g., titanium (Ti) or nickel (Ni)) or semi-metal (e.g., tin (Sn) or As). HOMSL material 402 may be doped or un-doped. HOMSL 402 may be epitaxially grown or deposited on the surface of substrate 304 rather than buried. FIG. 5 illustrates a cross-sectional perspective view depicting a vertical epitaxial layer structure of an example laser diode including a higher order mode suppression layer disposed adjacent to the lateral waveguide. In an example, laser diode 500 is a quantum well laser similar to the laser diode depicted in FIG. 3. However, laser diode 500 includes HOMSL aperiodic structure 502 comprising high- and low-index materials. Low-index material 506 has a lower index of refraction than high-index material 504 and the effective index of the lateral waveguide 340. High-index material 504 and low-index material 506 may comprise the same materials doped differently to achieve different indexes of refraction or may comprise different materials altogether. For example, high-index material 504 may comprise deposited dielectric or semiconductor and low-index material may comprise air, dielectric or semiconductor materials.

In an example, low- and high-index materials are alternated extending outward from the sides of lateral waveguide 340. Low-index material 506 is disposed adjacent to lateral waveguide 340. The low-index material 506 is closer to lateral waveguide 340 than the high-index material 340. High-index material 504 is disposed outside of low index material 506. The pattern of high-index/low-index material may repeat several times aperiodically in the HOMSL structure 502. As noted above, the aperiodic structure of HOMSL 502 can have an average index of refraction that is lower than the modal effective index in the lateral waveguide or higher than the modal index of the lateral waveguide. The materials selected for the aperiodic structure of HOMSL 502 are chosen to introduce high loss to higher order modes but to minimize loss to lower order modes/fundamental mode.

Figure 6:
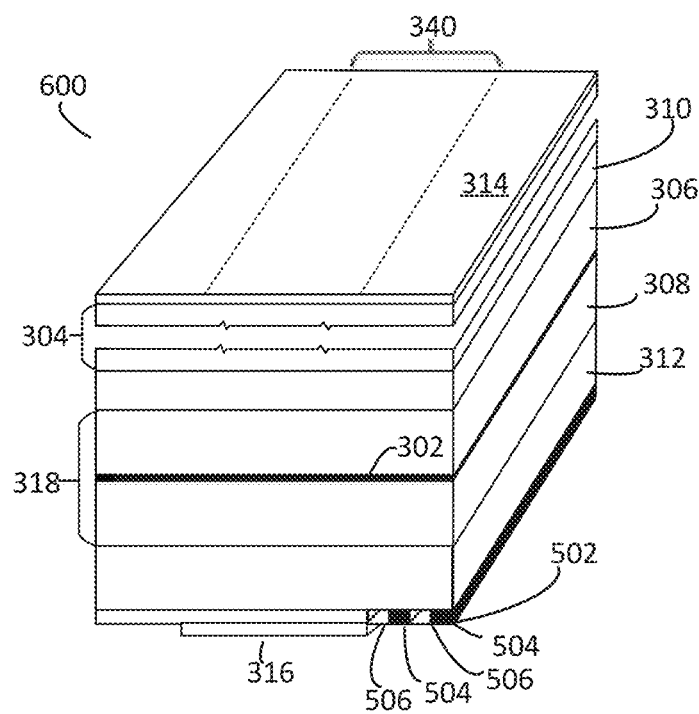
FIG. 6 illustrates a cross-sectional view depicting a vertical epitaxial layer structure of an example laser diode including a higher order mode suppression layer disposed adjacent to the lateral waveguide.

FIG. 6 illustrates a cross-sectional view depicting a vertical epitaxial layer structure of an example laser diode including a higher order mode suppression layer disposed adjacent to the lateral waveguide. In an example, laser diode 600 is a quantum well laser similar to the laser diode depicted in FIG. 5. However, laser diode 600 includes HOMSL 502 disposed on only one side of lateral waveguide 340. In an example, HOMSL 502 is configured to suppress higher order modes when distributed about waveguide 340 asymmetrically (as in this configuration) and/or where HOMSL structures are disposed symmetrically about waveguide 340.

Figure 7:
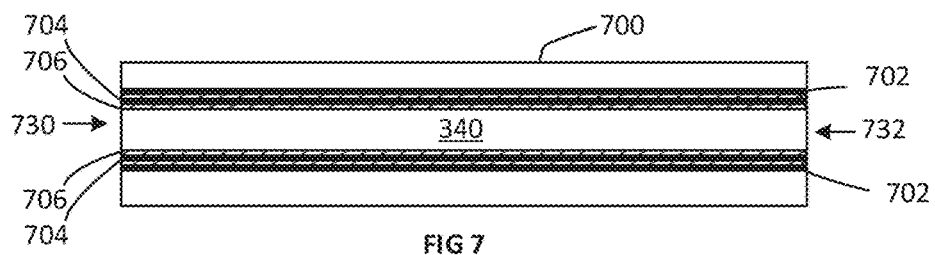
FIG. 7 illustrates a plan view depicting an example lateral waveguide of a broad area laser diode including a higher order mode suppression layer disposed adjacent the lateral waveguide along the longitudinal direction.

FIG. 7 illustrates a plan view depicting an example lateral waveguide of a broad area laser diode including a higher order mode suppression layer disposed adjacent the lateral waveguide along the longitudinal direction. In an example, broad area laser diode 700 comprises HOMSL 702 disposed symmetrically about lateral waveguide 340. HOMSL 702 is an aperiodic higher-order mode suppression layer structure comprising an area of low index material 706 alternating with an area of high index material 704. The low index material 706 has a lower index of refraction than the effective index of refraction of materials making up lateral waveguide 340. HOMSL 702 extends the entire length of lateral waveguide 340 from the rear facet 730 to the front facet 732.

Figure 8:
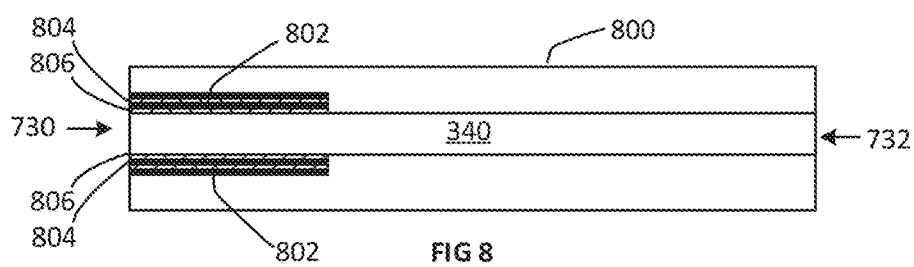
FIG. 8 illustrates a plan view depicting an example lateral waveguide of a broad area laser diode including a partial-length higher order mode suppression layer disposed adjacent the lateral waveguide along the longitudinal direction.

FIG. 8 illustrates a plan view depicting an example lateral waveguide of a broad area laser diode including a higher order mode suppression layer disposed adjacent the lateral waveguide along the longitudinal direction. In an example, broad area laser 800 comprises a shortened HOMSL 802 disposed symmetrically about lateral waveguide 340. HOMSL 802 comprises an aperiodic higher-order mode suppression layer having low index materials 806 alternating with high index materials 804 similar to that depicted in FIG. 5. However, HOMSL 802 does not extend the full length of lateral waveguide 340 from rear facet 730 to front facet 732. Rather, HOMSL 802 extends only a portion of the length of lateral waveguide 340 extending specifically from the rear facet 730. The rear facet 730 is coated with a highly reflective (HR) coating and the front facet 732 is coated with a partially reflective (PR) coating. Extending HOMSL 802 only a short length from the rear facet 730 has the advantage of minimizing loss for the unsuppressed modes so that laser diode operates more efficiently without significantly increasing the loss for lower order modes/fundamental mode because the total intensity of the forward and backward propagating fields along the longitudinal direction is smaller towards the back facet compared to the front facet. Hence, the losses are proportionately smaller.

Figure 9:
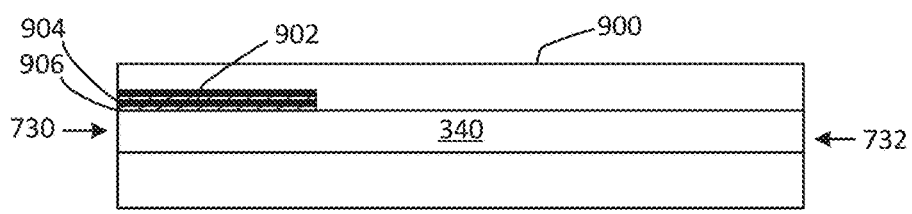
FIG. 9 illustrates a plan view depicting an example lateral waveguide of a broad area laser diode including a partial-length higher order mode suppression layer disposed adjacent the lateral waveguide along the longitudinal direction on only of the sides.

FIG. 9 illustrates a cross-sectional plan view depicting an example waveguide of a broad area laser diode including a higher order mode suppression layer disposed adjacent to the waveguide. In an example, broad area laser 900 comprises a shortened HOMSL 902 disposed asymmetrically about lateral waveguide 340 along the longitudinal direction. HOMSL 902 comprises an aperiodic higher-order mode suppression layer structure having low index materials 906 alternating with high index materials 904, similar to that depicted in FIG. 8. A single HOMSL 902 feature extends only a portion of the length of lateral of lateral waveguide 340 extending from the rear facet 730. Rear facet 730 is coated with an HR coating and front facet 732 is coated with a PR coating. Again, extending HOMSL 802 only a short length from the rear facet 730 has the advantage of minimizing loss for the unsuppressed modes so that laser diode operates more efficiently without significantly increasing the loss for lower order modes/fundamental mode.

Figure 10:
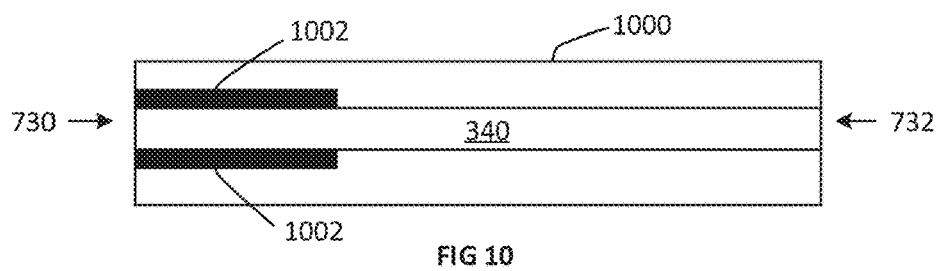
FIG. 10 illustrates a plan view depicting an example lateral waveguide of a broad area laser diode including a partial-length higher order mode suppression layer disposed adjacent the lateral waveguide along the longitudinal direction.

FIG. 10 illustrates a cross-sectional plan view depicting an example waveguide of a broad area laser diode including a higher order mode suppression layer disposed adjacent to the waveguide. In an example, broad area laser 1000 comprises a shortened HOMSL 1002 disposed symmetrically about lateral waveguide 340. HOMSL 1002 comprises a high-index material configured to have an index of refraction greater than the index of refraction of lateral waveguide 340. High-index material of HOMSL 1002 is capable of suppressing by anti-guiding higher order modes that spatially overlap with the high index material of HOMSL 1002 generated in lateral waveguide 340 while having little to no effect on lower order modes/fundamental mode generated therein because there is very little overlap between lower order modes/fundamental mode and the high index material.

Figure 11:
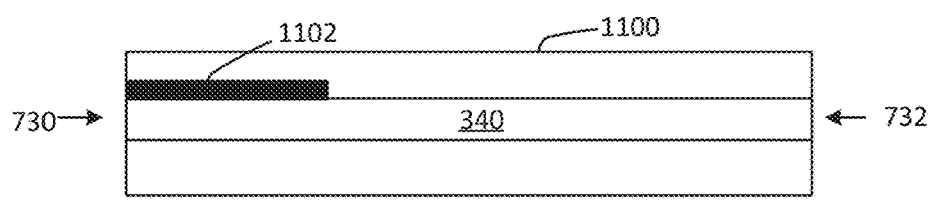
FIG. 11 illustrates a plan view depicting an example lateral waveguide of a broad area laser diode including a partial-length higher order mode suppression layer disposed adjacent the lateral waveguide along the longitudinal direction on only one side.

FIG. 11 illustrates a cross-sectional plan view depicting an example waveguide of a broad area laser diode including a higher order mode suppression layer disposed adjacent to the waveguide. In an example, broad area laser 1100 comprises a shortened HOMSL 1102 disposed asymmetrically about lateral waveguide 340. HOMSL 1102 comprises a high-index material similar to that illustrated in FIG. 10. HOMSL 1102 provides anti-guiding to higher-order modes generated in lateral waveguide 340. It is not necessary for HOMSL 1102 to be distributed symmetrically about lateral waveguide 340 in order to anti-guide at least some of the higher-order modes. Furthermore, the single HOMSL 1102 feature extends only a portion of the length of lateral waveguide 340 extending from the rear facet 730. Rear facet 730 is coated with an HR coating and front facet 732 is coated with a PR coating. Again, extending HOMSL 1102 only a short length from the rear facet 1130 has advantage of suppressing higher-order modes while minimizing loss for the unsuppressed modes so that the laser diode operates more efficiently without significantly increasing the loss for lower order modes and/or fundamental mode.

Figure 12:
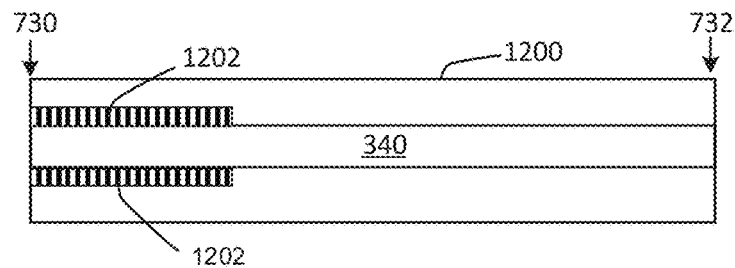
FIG. 12 illustrates a plan view depicting an example lateral waveguide of a broad area laser diode including a partial-length higher order mode suppression layer disposed adjacent the lateral waveguide along the longitudinal direction.

FIG. 12 illustrates a cross-sectional plan view depicting an example waveguide of a broad area laser including a higher order mode suppression layer disposed adjacent to a waveguide. In an example, broad area laser 1200 comprises a shortened HOMSL 1202 disposed symmetrically about lateral waveguide 340. HOMSL 1202 comprises an absorbing material that can either be semiconductor material in a variety of compositions, doping, crystallinity and/or morphology; semi-metals; or metals. The absorbing material functions to suppress higher-order modes in the lateral direction in lateral waveguide 340 by disproportionately increasing the round-trip loss of the higher order modes. HOMSL 1202 does not extend the full length of lateral waveguide 340 from rear facet 730. HOMSL 1202 extends only a portion of the length of lateral waveguide 340 extending specifically from rear facet 730. Extending HOMSL 1202 only a short length from the rear facet 730 has advantage of minimizing loss for the unsuppressed modes so laser diode operates more efficiently without significantly increasing loss for lower order modes/fundamental mode.

Figure 13:
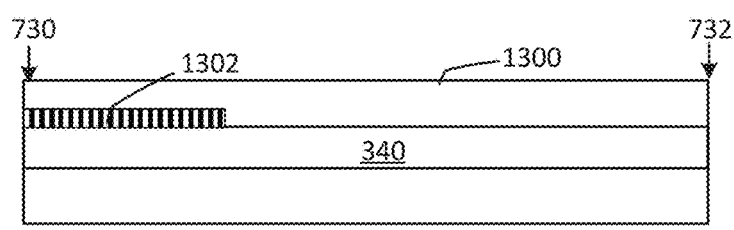
FIG. 13 illustrates a plan view depicting an example lateral waveguide of a broad area laser diode including a partial-length higher order mode suppression layer disposed adjacent the flared laser oscillator waveguide along the longitudinal direction on only one side.

FIG. 13 illustrates a cross-sectional plan view depicting an example flared laser oscillator waveguide including a higher order mode suppression layer disposed adjacent to the waveguide. An example, broad area laser 1300 comprises a shortened HOMSL 1302 disposed asymmetrically about lateral waveguide 340. HOMSL 1302 comprises an absorbing material similar to that illustrated in FIG. 12. HOMSL 1302 absorbs disproportionately higher-order modes in the lateral waveguide 340 thereby suppressing higher-order modes that overlap more spatially with HOMSL 1302. Therefore HOMSL 1302 suppresses higher-order modes minimizing impact on lower order modes and fundamental mode. Additionally, the single HOMSL 1302 feature extends only a portion of the length of lateral waveguide 340 extending from the rear facet 730. Rear facet 1330 is coated with HR coating and front facet 732 is coated with a PR coating. Extending HOMSL 1302 only a short length from the rear facet 730 has the advantage of suppressing higher-order modes while minimizing loss for the unsuppressed modes so the laser diode operates more efficiently without significantly increasing loss for lower order modes/fundamental mode.

Figure 14:
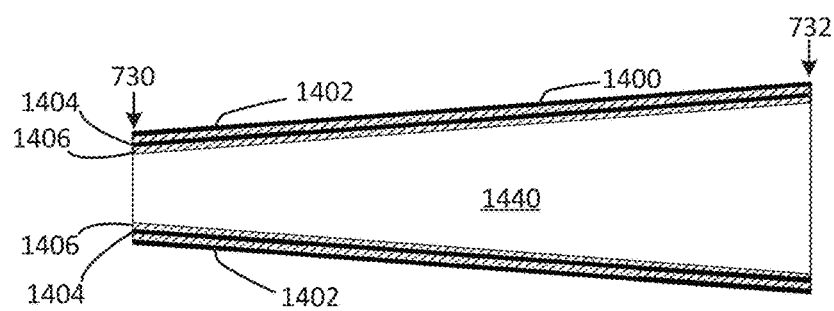
FIG. 14 illustrates a plan view depicting an example flared laser oscillator waveguide (i.e., lateral waveguide) laser diode including a higher order mode suppression layer disposed adjacent the flared laser oscillator waveguide along the longitudinal direction.

FIG. 14 illustrates a plan view depicting an example flared laser oscillator waveguide including a higher order mode suppression layer disposed adjacent to the waveguide. An example, laser 1400 includes flared laser oscillator waveguide (FLOW) 1418 may be used in place of a rectangular broad area laser waveguide. FLOW 1440 comprises a flared current injection region extending and widening between back facet 730 comprising high reflector (HR) coating and front facet 732 comprising a partial reflector (PR) coating along the longitudinal direction. By narrowing the width of the electrically-pumped stripe towards the high reflector facet, the higher order modes with higher divergence angles are prevented from coupling back into the laser. As a result, the slow-axis divergence of the laser is smaller compared to a device with rectangular geometry having the same width for the partial reflector. Furthermore, light propagating in the flared current injection region closer to PR front facet 732 can form a thermal waveguide that is closer to the width of the narrower, HR back facet 730 side causing a beam output at front facet 732 to have a substantially narrower beam width than the front facet 732 width. As a result, the-beam-parameter-product, BPP (slow-axis near-field width times the slow-axis divergence) is smaller for FLOW devices compared to BAL devices. Since the near-field is smaller than the physical width at the front facet 732 side, FLOW devices can be designed to have a larger total area compared to BAL without sacrificing BPP. The enlarged total pumped area provided by the flaring of the flared current injection region serves to reduce thermal resistance and electrical series resistance in the device, resulting in higher electrical-to-optical power conversion efficiency. This leads to higher output power at a given operating current compared to BAL devices. Higher power and smaller BPP leads to increased beam brightness in the slow-axis. In addition to the application to broad area diode lasers, the FLOW concept can also be applied to other types of semiconductor-based Fabry-Perot lasers, such as quantum cascade laser (QCL), interband quantum cascade lasers (IQL), by way of example. Broad area diode lasers with flared laser oscillator waveguides can also find particular use in laser diode modules, which can be configured for various applications such as fiber-coupling or direct pumping.

In an example, HOMSL 1402 may comprise an aperiodic structure of a first layer of low index material 1406 wherein the index of low index material 1406 is less than the effective refractive index of the material making up FLOW 1440. HOMSL 1402 also includes a second layer of high index material 1404 wherein the index of the high index material 1404 is greater or lower than the effective refractive index of the material making up FLOW 1440. Therefore, as described above with reference to FIG. 5, HOMSL 1402 may be in the index guiding or anti-guiding regime. Referring still to FIG. 14, HOMSL 1402 coupled with FLOW 1440 compound any higher order mode suppression effects that might be achieved with either HOMSL 1402 or FLOW 1440 alone to further reduce BPP.

Figure 15:
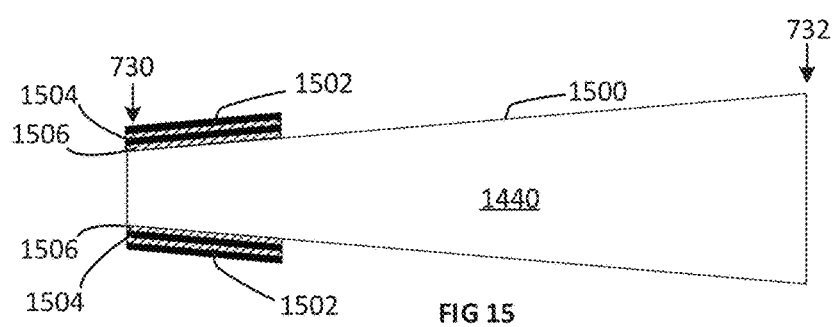
FIG. 15 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 15 illustrates a cross-sectional plan view depicting an example flared laser oscillator waveguide including a higher order mode suppression layer disposed adjacent to the waveguide. In an example, laser diode 1500 includes FLOW 1440 and shortened HOMSL 1502 disposed symmetrically about FLOW 1440. HOMSL 1502 comprises aperiodic structure including low index material 1506 and high index material 1504 assembled as described in FIG. 14. In an example, HOMSL 1502 extends only a portion of the length of FLOW 1440 from rear facet 730. HOMSL 1502 is not disposed near front facet 732. This architecture compounds the higher-order mode suppression achieved by a HOMSL structure in combination with a FLOW structure because extending HOMSL 1502 less than the full-length of FLOW 1440 minimizing loss for the unsuppressed modes so that laser diode operates more efficiently without significantly increasing the loss for lower order modes/fundamental mode, as explained above with respect to FIG. 8.

Figure 16:
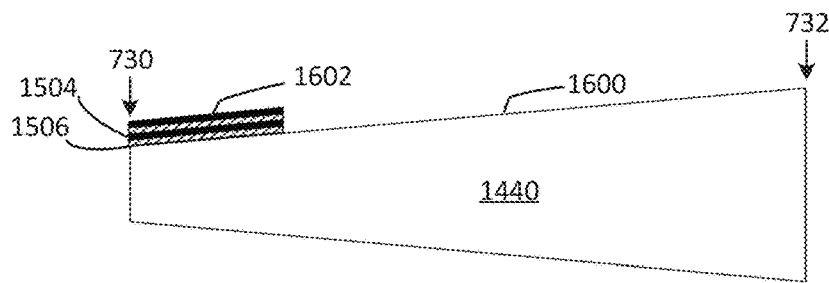
FIG. 16 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 16 illustrates a cross-sectional plan view depicting an example of a flared laser oscillator waveguide including a higher order mode suppression layer disposed adjacent to the waveguide. In an example, laser diode 1600 may comprise a HOMSL 1602 distributed asymmetrically about a FLOW 1440. HOMSL 1602 may extend only a partial length of FLOW 1440 from rear facet 730. In an example, a single shortened HOMSL 1602 combined with FLOW 1440 may operate to efficiently suppress higher-order modes. Such architecture may be desirable to, for example, save materials costs or accommodate other structures in the epitaxial layer structure of laser diode 1600.

Figure 17:
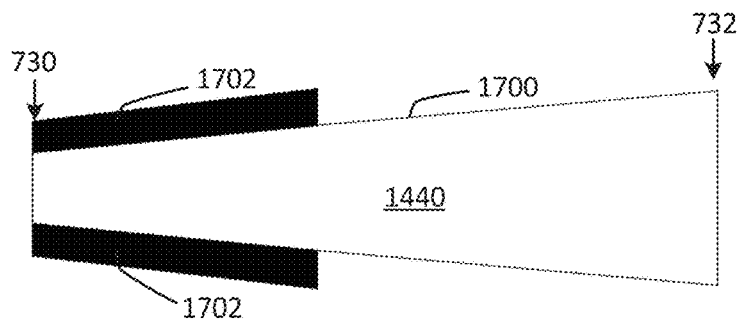
FIG. 17 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 17 illustrates a plan view depicting an example waveguide of a laser diode including a higher order mode suppression layer disposed adjacent to the wave guide. In an example, laser diode 1700 includes FLOW 1440 and HOMSL 1702 disposed symmetrically about FLOW 1440. HOMSL 1702 is shortened, extending from rear facet 730 only a portion of the length of FLOW 1440. HOMSL 1702 comprises high-index material compared to the material used in FLOW 1440. By narrowing the width of the electrically-pumped stripe of FLOW 1440 towards the high reflector facet, the higher order modes with higher divergence angles are prevented from coupling back into the laser. The shortened HOMSL 1702 provides further suppression of higher order modes by disproportionately anti guiding higher order modes that overlap with the high index material towards the HR facet.

Figure 18:
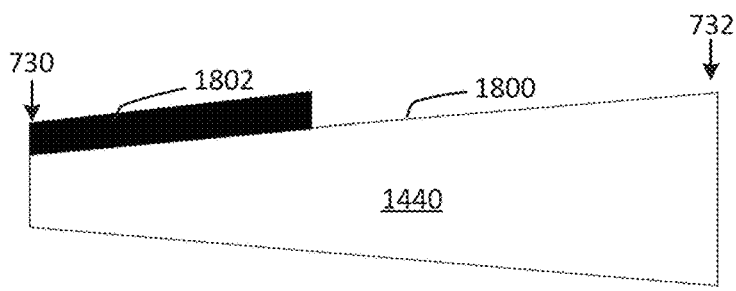
FIG. 18 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 18 illustrates a plan view depicting an example waveguide of a laser including a higher order mode suppression layer disposed adjacent to a waveguide. In an example, laser 1800 may comprise shortened HOMSL 1802 distributed asymmetrically about FLOW 1440. HOMSL 1802 may comprise a high-index material similar to that described in FIG. 17. HOMSL 1802 may extend only a partial length from rear facet 730 of FLOW 1440 from rear facet 730. The single shortened HOMSL 1802 combined with FLOW 1440 may operate to efficiently suppress higher-order modes. This architecture may be desirable to, for example, save materials costs or accommodate other structures in the epitaxial layer structure of laser 1800.

Figure 19:
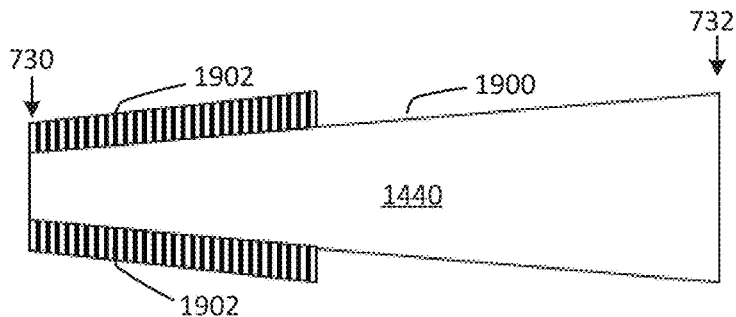
FIG. 19 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 19 illustrates a plan view depicting an example flared laser oscillator waveguide including a higher order mode suppression layer disposed adjacent to the waveguide. In an example, laser diode 1900 includes FLOW 1440. HOMSL 1902 is disposed symmetrically about FLOW 1440. HOMSL 1902 is shortened, extending from rear facet 730 only a portion of the length of FLOW 1440. HOMSL 1902 comprises absorbing material. As discussed with reference to FIG. 4, the absorbing material introduces higher loss preferentially to the higher order modes and thereby suppresses higher-order modes that spatially overlap with HOMSL 1902.

Figure 20:
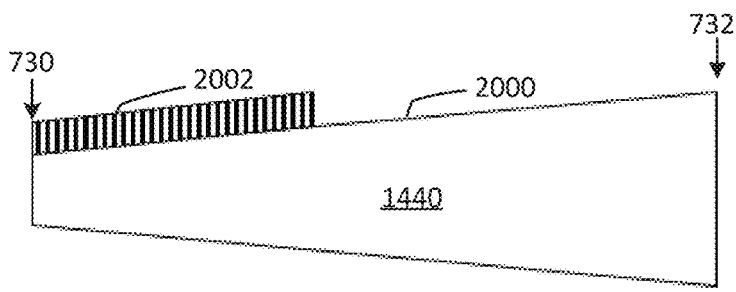
FIG. 20 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 20 illustrates a cross-sectional plan view depicting an example flared laser oscillator waveguide including a higher order mode suppression layer disposed adjacent to the waveguide. In an example, laser 2000 may comprise shortened HOMSL 2002 distributed asymmetrically about FLOW 1440. HOMSL 2002 may comprise an absorbing material similar to that described with respect to FIG. 19. HOMSL 2002 may extend only a partial length from rear facet 730 of FLOW 1440. A single shortened HOMSL 2002 combined with FLOW 1440 may operate to more efficiently suppress higher-order modes than either HOMSL 2002 or FLOW 1440 alone. This architecture may be desirable to, for example, save materials costs or accommodate other structures in the epitaxial layer structure of laser 2000.

Gain Tailoring Approach

Figure 27:
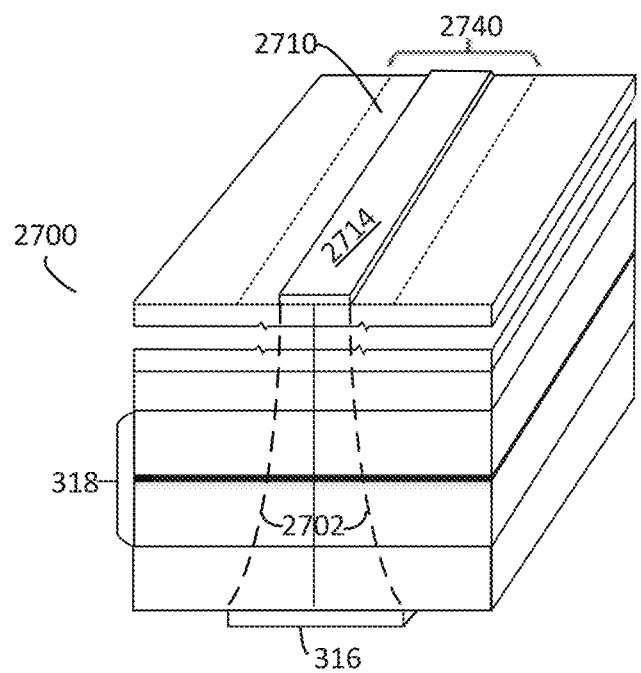
FIG. 27 illustrates a cross-sectional perspective view depicting a vertical epitaxial layer structure of an example laser diode including a tailored n-side current injection scheme.

In an example, higher order modes may be reduced in the lateral waveguide by reducing the amount of current that reaches the active layer in the lateral waveguide in which higher order modes proliferate. This can be accomplished through gain tailoring. Conventionally, gain tailoring involves current injection from the p-side of the heterostructure. However, gain tailoring from the p-side is fraught with inefficiencies. Gain tailoring from the n-side, on the other hand, generates diffused carrier distribution that overlaps more closely to primarily the fundamental mode and then to the lower order mode profiles, providing higher gain to the desired modes and lower gain to the undesirable higher order modes FIG. 27 illustrates a cross-sectional perspective view depicting a vertical epitaxial layer structure of an example laser diode including a tailored n-side current injection scheme. In an example, gain tailoring is performed by current injection via n-metal contact 2714 that is patterned to be narrower than p-metal contact 316. N-metal contact 2714 is disposed in the center of lateral waveguide 2740 in the longitudinal direction and cavity 2710 enabling lateral carrier distribution pattern 2702.

Figure 28:
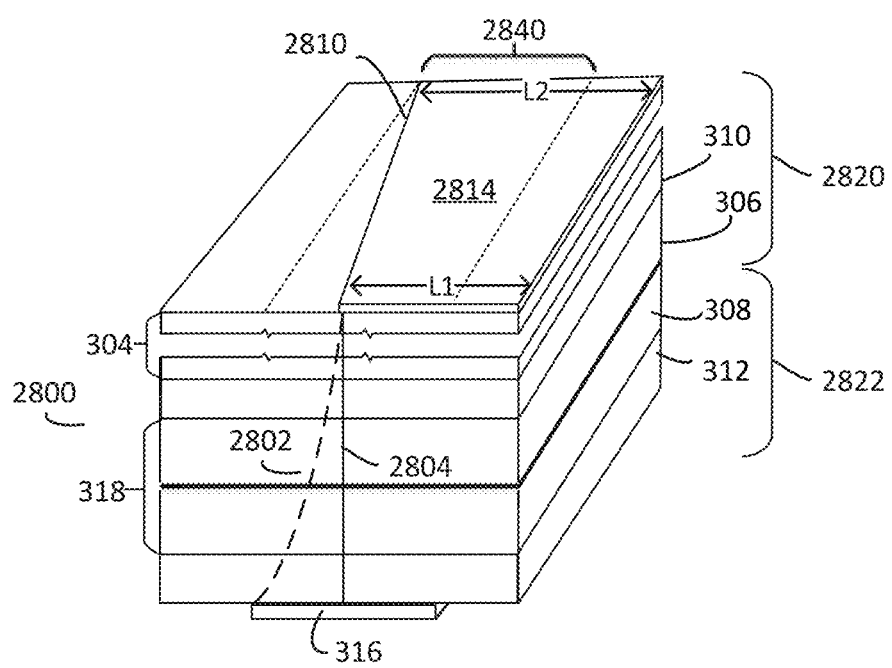
FIG. 28 illustrates a cross-sectional perspective view depicting a vertical epitaxial layer structure of an example laser diode including a tailored n-side current injection scheme.

FIG. 28 illustrates a cross-sectional perspective view depicting a vertical epitaxial layer structure of an example laser diode including a tailored n-side current injection scheme. Laser diode 2800 comprises an n-side 2820 and a p-side 2822. N-side 2820 includes n-metal contact 2814, n-cladding layer 310, n-type semiconductor layer 306 and n-substrate 304. P-side 2822 includes p-cladding layer 312, p-type semiconductor layer 308, and p-metal contact 316. Transverse waveguide 318 comprises quantum well 302, n-type semiconductor layer 306 and p-type semiconductor layer 308. Longitudinal waveguide 2840 can be defined in a variety of ways (e.g., by gain guiding, ridge waveguide, or index guiding or the like or a combination thereof), illustrated by dotted lines shown on top of substrate 304 and n-metal contact 2814. P-metal contact 316 is positioned under p-cladding layer 312. N-metal contact 2814 extends along cavity 2810 of longitudinal waveguide 2840.

Gain tailoring from the n-side may be achieved by introduction of a lateral carrier distribution pattern 2802 by disposing a narrow strip of n-metal contact 2814 on the n-side 2820 of laser diode 2800 rather than the conventional metallizing of the full n-side. Thin n-metal contact 2814 may be disposed at a variety of locations opposite p-metal contact 316. In one example, n-metal contact 2814 is offset such that its edge is located at the emitter half-plane 2804. Gain tailoring is performed from the n-metal side 2820 that reduces higher-order modes propagating in waveguide 2840 by reducing the amount of gain to the higher-order modes.

In an example, n-metal contact 2814 can have a variable width along the cavity in order to modulate the carrier profile in the lateral and longitudinal directions. This is shown in FIG. 28 wherein a first width L1 of n-metal contact 2814 is less than a second width L2. This provides gain tailoring in the longitudinal direction which reduces gain to the higher order modes towards HR (high reflective) facet so that laser diode 2800 operates more efficiently without significantly increasing the loss for lower order modes/fundamental mode.

Figure 29:
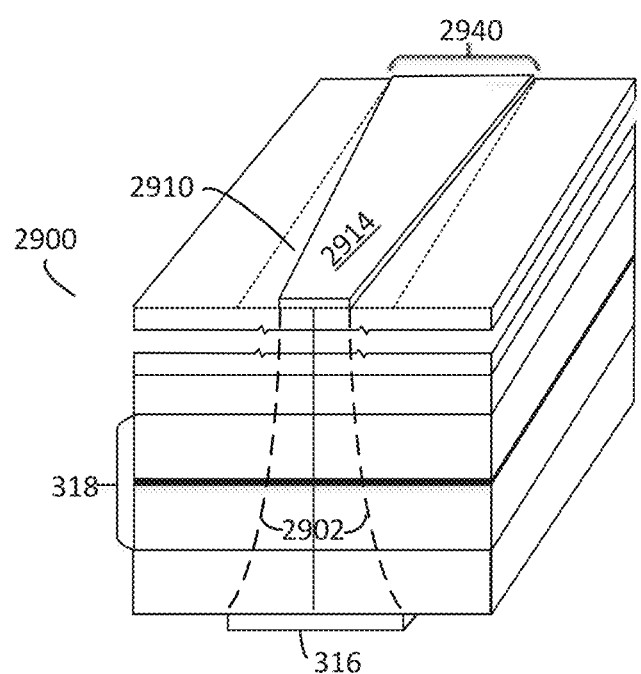
FIG. 29 illustrates a cross-sectional perspective view depicting a vertical epitaxial layer structure of an example laser diode including a tailored n-side current injection scheme.

FIG. 29 illustrates a cross-sectional perspective view depicting a vertical epitaxial layer structure of an example laser diode including a tailored n-side current injection scheme. In an example, gain tailoring is performed by current injection via flared n-metal contact 2914 that is patterned to be narrower than p-metal contact 316. N-metal contact 2914 is narrower on HR side and wider on PR side (but centered laterally). N-metal contact 2914 is disposed in the center of lateral waveguide 2940 in the longitudinal direction and cavity 2910 enabling lateral carrier distribution pattern 2902.

Hybrid Gain Tailoring/HOMSL Approach

Further reduction of higher-order modes in a lateral waveguide may be performed using a hybrid approach by 1) reducing proliferation of higher-order modes in the waveguide by using a tailored current injection scheme to tailor gain or discriminate gain to higher-order modes thereby starving them of gain and suppressing the higher-order modes and 2) including a HOMSL structure adjacent to the lateral waveguide along the longitudinal direction to further suppress higher-order modes generated despite the gain tailoring.

Figure 21A:
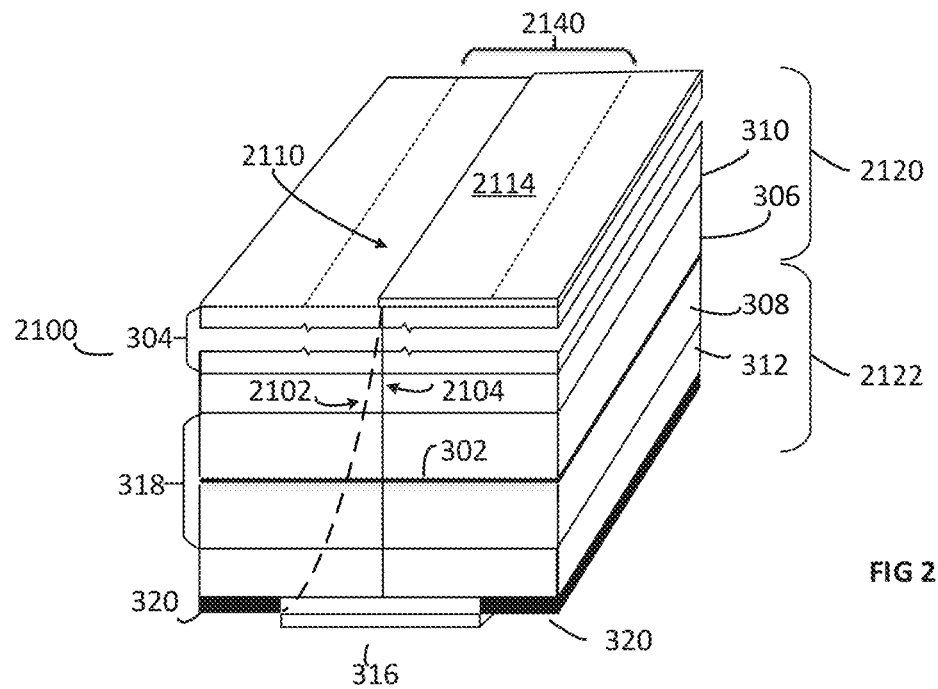
FIG. 21A illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

FIG. 21A illustrates a cross-sectional perspective view depicting a vertical epitaxial layer structure of an example laser diode including a tailored n-side current injection scheme and a higher order mode suppression layer disposed adjacent to the lateral waveguide. Laser diode 2100 comprises an n-side 2120 and a p-side 2122. N-side 2120 includes n-metal contact 2114, n-cladding layer 310, n-type semiconductor layer 306 and n-substrate 304. P-side 2122 includes p-cladding layer 312, p-type semiconductor layer 308, p-metal contact 316 and HOMSL 320. Waveguide 318 comprises quantum well 302, n-type semiconductor layer 306 and p-type semiconductor layer 308. Longitudinal waveguide 2140 is defined in a variety of ways (e.g., by gain guiding, ridge waveguide, or index guiding or the like or a combination thereof). Longitudinal waveguide 2140 includes cavity 2110 illustrated by dotted lines shown on top of substrate 304 and n-metal contact 2114. P-metal contact 316 is positioned under p-cladding layer 312. N-metal contact 2114 extends along cavity 2110 of longitudinal waveguide 2140.

As discussed above, gain tailoring from the n-side may be achieved by introduction of a lateral carrier distribution pattern 2102 by disposing n-metal contact 2114 on the n-side of laser diode. In FIG. 21A, n-metal contact 2114 is offset such that its edge is located at the emitter half-plane 2104. Carrier injection is performed from the n-metal side. Additionally, HOMSL 320 comprising a high-index material is disposed symmetrically along the longitudinal direction about lateral waveguide 2110. This hybrid approach can reduce higher-order modes propagating in waveguide 2140 by reducing the amount of gain to the higher-order modes and suppressing higher-order modes via HOMSL 320.

Figure 21B:
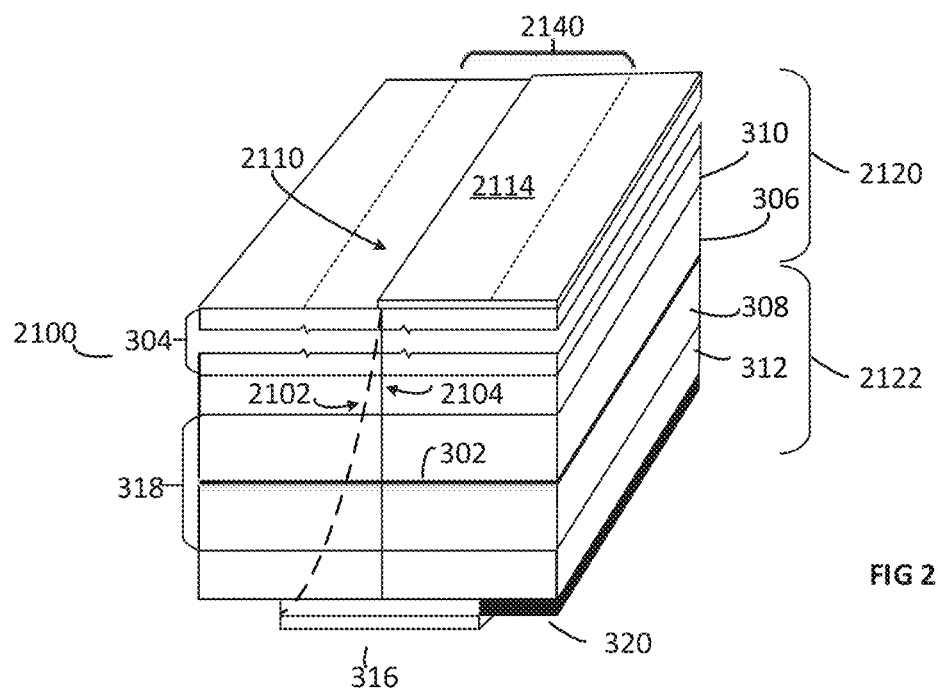
FIG. 21B illustrates a cross-sectional perspective view depicting a vertical epitaxial layer structure of an example laser diode including a tailored n-side current injection scheme and a higher order mode suppression layer disposed adjacent to the lateral waveguide along the longitudinal.

In another example, a HOMSL structure that is disposed asymmetrically about waveguide 2140 may be used rather than a symmetrically disposed HOMSL structure. In one example, asymmetric HOMSL structure, as illustrated in FIGS. 9, 11, 16, 18, and 20 should be disposed in-line in the heterostructure with the n-metal contact 2114 as shown in FIG. 21B. This configuration is more efficient than having the HOMSL structure on the opposite side because the higher-order mode is gain starved and will be below threshold carrier density.

Figure 22:
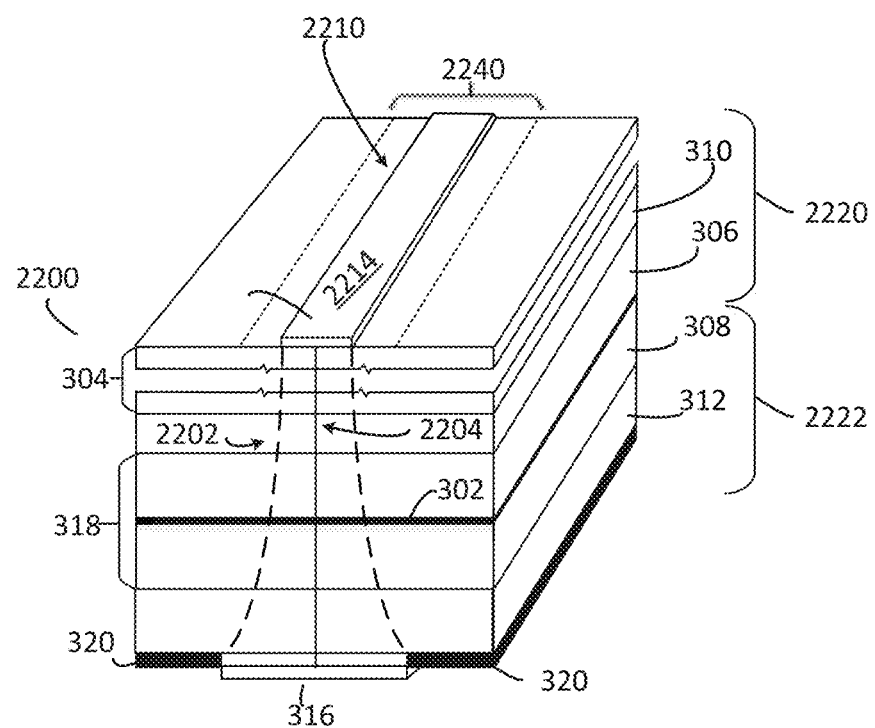
FIG. 22 illustrates a cross-sectional perspective view depicting a vertical epitaxial layer structure of an example laser diode including a tailored n-side current injection scheme and a higher order mode suppression layer disposed adjacent to the lateral waveguide along the longitudinal.

Furthermore, other HOMSL structures may be used to perform the hybrid gain tailoring/HOMSL higher order mode suppression method described herein. For example, rather than using the high index materials of HOMSL 320, absorbing and/or aperiodic materials as described above with respect to HOMSL 402 of FIG. 4 and HOMSL 502 of FIG. 5 may be used. Moreover, hybrid gain tailoring/HOMSL approach using p-side gain tailoring will provide improved higher order mode suppression over convention p-side gain tailoring or higher order mode suppression using a HOMSL structure alone. FIG. 22 illustrates a cross-sectional perspective view depicting a vertical epitaxial layer structure of an example laser diode including a tailored n-side current injection scheme and a higher order mode suppression layer disposed adjacent to the waveguide. In an example, n-metal contact 2214 is patterned to be narrower than the width of p-metal contact 316. N-metal contact 2214 is centered at the half-plane 2204 of the waveguide 2240. Doing so generates diffused carrier distribution along the path indicated by 2202 in the lateral direction thus creating carrier density profile that overlaps much closely primarily to the fundamental mode and then to the lower order mode profiles compared to the suppressed higher order modes. This current injection profile is configured to optimize overlap with the lateral lower order modes and fundamental modes by providing higher gain to the desired modes and lower gain to the undesirable higher order modes. Additionally, the width of n-metal contact 2214 can be variable along cavity 2210 to modulate the magnitude of the carriers injected along the longitudinal direction of cavity 2210.

Figure 23:
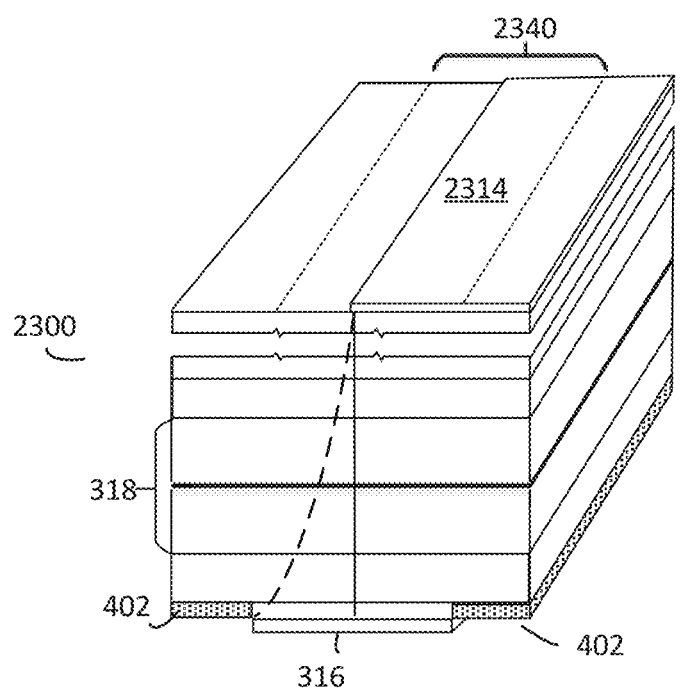
FIG. 23 illustrates a cross-sectional perspective view depicting a vertical epitaxial layer structure of an example laser diode including a tailored n-side current injection scheme and a higher order mode suppression layer disposed adjacent to the lateral waveguide along the longitudinal.

FIG. 23 illustrates a cross-sectional perspective view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2314 that is offset with respect to p-metal contact 316. HOMSL 402 (see FIG. 4) is positioned symmetrically about lateral waveguide 2340 along the longitudinal direction and comprises an absorbing material. In an example, HOMSL 402 can be n- or p-doped GaAs or ordered or disordered-InGaAs with lower bandgap than the laser wavelength.

Figure 24:
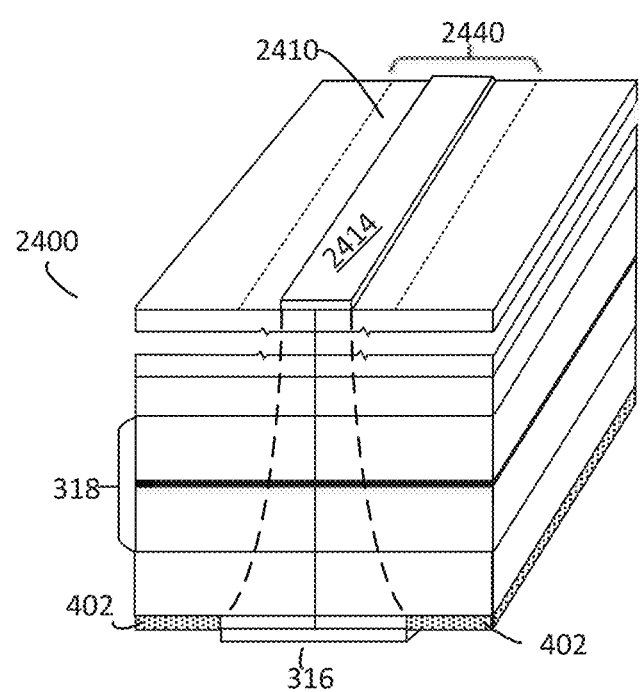
FIG. 24 illustrates a cross-sectional perspective view depicting a vertical epitaxial layer structure of an example laser diode including a tailored n-side current injection scheme and a higher order mode suppression layer disposed adjacent to the lateral waveguide along the longitudinal.

FIG. 24 illustrates a cross-sectional perspective view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2414 that is patterned to be narrower than p-metal contact 316. N-metal contact 2414 is disposed in the center of lateral waveguide 2440 and cavity 2410. HOMSL 402 (see FIG. 4) is positioned symmetrically about lateral waveguide 2440 and comprises an absorbing material.

Figure 25:
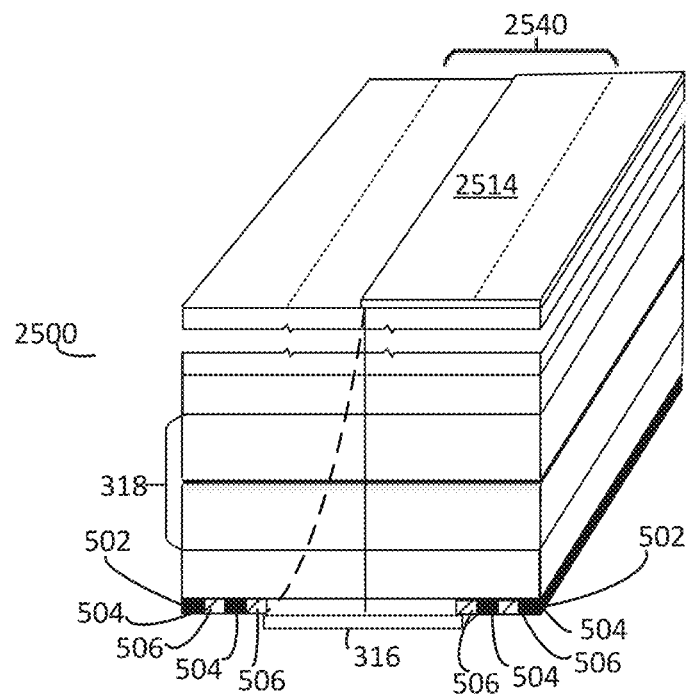
FIG. 25 illustrates a cross-sectional perspective view depicting a vertical epitaxial layer structure of an example laser diode including a higher order mode suppression layer disposed adjacent to the lateral waveguide along the longitudinal.

FIG. 25 illustrates a cross-sectional view depicting a vertical epitaxial layer structure of an example laser diode including a tailored n-side current injection scheme and a higher order mode suppression layer disposed adjacent to the waveguide. In an example, gain tailoring is performed via n-metal contact 2514 that is offset with respect to p-metal contact 316. HOMSL 502 (see FIG. 5) comprising aperiodic high index layer 504 and low index layer 506 is positioned symmetrically about lateral waveguide 2540.

Figure 26:
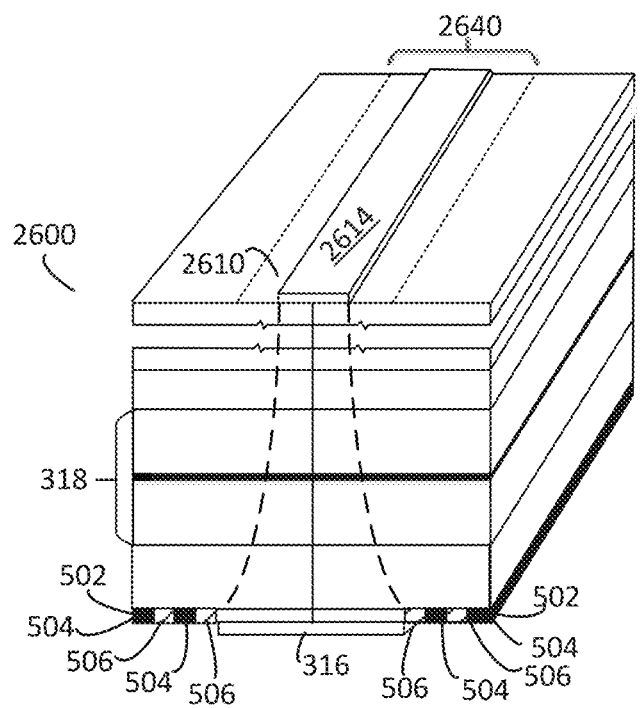
FIG. 26 illustrates a cross-sectional perspective view depicting a vertical epitaxial layer structure of an example laser diode including a higher order mode suppression layer disposed adjacent to the lateral waveguide along the longitudinal.

FIG. 26 illustrates a cross-sectional view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2614 that is patterned to be narrower than p-metal contact 316. N-metal contact 2614 is disposed in the center of waveguide 2640 and cavity 2610. HOMSL 502 (see FIG. 5) is positioned symmetrically about longitudinal waveguide 2440 and comprises an absorbing material.

The foregoing descriptions of laser diodes, epitaxial layer structures, various features/structures within the epitaxial layers and waveguides are merely examples and are included for illustrative purposes; other structures and features or combinations of structures and/or features are contemplated and within the scope of the disclosed subject matter and claim subject matter is not limited in this regard.

Having described and illustrated the general and specific principles of examples of the presently disclosed technology, it should be apparent that the examples may be modified in arrangement and detail without departing from such principles. We claim all modifications and variation coming within the spirit and scope of the following claims.

What is claimed is:

1. A laser diode vertical epitaxial structure, comprising:
    a transverse waveguide comprising an active layer between an n-type semiconductor layer and a p-type semiconductor layer wherein the transverse waveguide is bounded by a lower index n-cladding layer on an n-side of the transverse waveguide and a lower index p-cladding layer on a p-side of the transverse waveguide;
    a lateral waveguide that is orthogonal to the transverse waveguide, wherein the lateral waveguide is bounded in a longitudinal direction at a first end by a facet coated with a high reflector (HR) coating and at a second end by a facet coated with a partial reflector (PR) coating; and
    a higher order mode suppression layer (HOMSL) disposed adjacent to at least one lateral side of the lateral waveguide and that extends in a longitudinal direction, the HOMSL extending in a longitudinal direction from the HR facet a length less than the distance between the first end and the second end.

2. The laser diode epitaxial structure of claim 1, wherein the HOMSL comprises an absorbing material or an aperiodic structure comprising at least two different materials having different indexes of refraction, or any combination thereof.

3. The laser diode epitaxial structure of claim 2, wherein the HOMSL comprises the aperiodic structure comprising a pattern of a low-index material alternating with a high index material wherein the low-index material has an index of refraction that is less than an effective index of refraction of the lateral waveguide and wherein the high-index material has an index of refraction that is higher than the effective index of refraction of the lateral waveguide.

4. The laser diode epitaxial structure of claim 3, wherein an average index of refraction of the aperiodic structure is less than an effective index of refraction of the lateral waveguide such that the HOMSL is index-guiding.

5. The laser diode epitaxial structure of claim 3, wherein an average index of refraction of the aperiodic structure is greater than an effective index of refraction of the lateral waveguide.

6. The laser diode epitaxial structure of claim 1, wherein the HOMSL is arranged in two rectangular stripes having one of each of the two rectangular HOMSL stripes along each of two lateral sides of the lateral waveguide in the longitudinal direction.

7. The laser diode epitaxial structure of claim 6, wherein the two rectangular HOMSL stripes extend from the first end a distance less than the distance between the first end and the second end.

8. The laser diode epitaxial structure of claim 1, wherein the HOMSL is arranged in a single rectangular stripe along one lateral side of the lateral waveguide in the longitudinal direction.

9. The laser diode epitaxial structure of claim 8, wherein the rectangular HOMSL stripe extend from the first end a distance less than the distance between the first end and the second end.

10. The laser diode epitaxial structure of claim 1, wherein the lateral waveguide is defined by at least one of an etched-ridge or current injection with gain guiding.

11. The laser diode epitaxial structure of claim 1, wherein the lateral waveguide is confined by current injection with gain guiding.

12. The laser diode epitaxial structure of claim 11, wherein the current injection is configured to enable higher order mode suppression via gain tailoring.

13. The laser diode epitaxial structure of claim 12, wherein the gain tailoring is directed from an n-metal contact on the n-side of the laser diode epitaxial structure to the p-metal contact on the p-side of the epitaxial structure.

14. The laser diode epitaxial structure of claim 13, wherein the n-metal contact is narrower in the lateral direction than the p-metal contact in the lateral direction.

15. The laser diode epitaxial structure of claim 13, wherein a first edge of the n-metal contact aligns to a center-plane of an emitter face of the laser diode epitaxial structure.

16. The laser diode epitaxial structure of claim 13, wherein a first edge of the n-metal contact is parallel with the HR facet and a second edge is parallel with the PR facet and wherein the first edge is narrower than the second edge.

17. A laser diode, comprising:
    a transverse waveguide comprising an active layer between an n-type semiconductor layer and a p-type semiconductor layer wherein the transverse waveguide is bounded by a lower index n-cladding layer on an n-side and a p-cladding layer on a p-side;
    a lateral waveguide that is orthogonal to the transverse waveguide, the lateral waveguide defined by at least one of an etched ridge or current injection with gain guiding, or a combination thereof, the lateral waveguide bounded in the longitudinal direction at a first end by a facet coated with a high reflector coating and at a second end by a facet coated with a partial reflector coating; and a higher order mode suppression layer (HOMSL) disposed adjacent to the lateral waveguide and extending in a longitudinal direction from the HR facet a length less than the distance between the HR facet and the PR facet.

18. The laser diode of claim 17, wherein the HOMSL comprises a high-index material, an absorbing material or an aperiodic material, or any combination thereof.

* * * * *